(12) United States Patent
Park et al.

(10) Patent No.: US 8,138,422 B2
(45) Date of Patent: Mar. 20, 2012

(54) PRINTED CIRCUIT BOARD WITH CONDUCTIVE INK/PASTE, HAVING PLATING LAYERS, AND METHOD FOR MANUFACTURING THE SAME

(75) Inventors: Se-Ho Park, Suwon-si (KR); Ki-Hyun Kim, Suwon-si (KR); Seok-Myong Kang, Yongin-si (KR); Young-Min Lee, Yongin-si (KR)

(73) Assignee: Samsung Electronics Co., Ltd (KR)

( * ) Notice: Subject to any disclaimer, the term of this patent is extended or adjusted under 35 U.S.C. 154(b) by 320 days.

(21) Appl. No.: 12/512,588

(22) Filed: Jul. 30, 2009

(65) Prior Publication Data

US 2010/0025080 A1 Feb. 4, 2010

(30) Foreign Application Priority Data

Jul. 30, 2008 (KR) ........................ 10-2008-0074522

(51) Int. Cl.
*H05K 1/00* (2006.01)
*H05K 1/03* (2006.01)
*H05K 1/09* (2006.01)

(52) U.S. Cl. ........ 174/250; 174/251; 174/255; 174/256; 174/257

(58) Field of Classification Search .................. None
See application file for complete search history.

(56) References Cited

U.S. PATENT DOCUMENTS 6,406,990 B1 * 6/2002 Kawai ........................ 438/612

FOREIGN PATENT DOCUMENTS

EP 2150095 A1 * 2/2010
JP 2010258284 A * 11/2010

* cited by examiner

*Primary Examiner* — Boris Chervinsky
(74) *Attorney, Agent, or Firm* — The Farrell Law Firm, P.C.

(57) ABSTRACT

A Printed Circuit Board (PCB) and a method for manufacturing the same are provided. A circuit pattern is formed by printing conductive ink/paste on a substrate, and sintering a layer of the conductive ink or curing a layer of the conductive paste by applying heat. A primary plating layer is formed through electroless plating or electrolytic plating of a high-melting point metal on the circuit pattern. A secondary plating layer is formed through electroless plating or electrolytic plating of a precious metal on the primary plating layer to improve wetting with solder.

9 Claims, 2 Drawing Sheets

PRINTED CIRCUIT BOARD WITH CONDUCTIVE INK/PASTE, HAVING PLATING LAYERS, AND METHOD FOR MANUFACTURING THE SAME

PRIORITY

This application claims priority under 35 U.S.C. §119(a) to a Korean Patent Application filed in the Korean Intellectual Property Office on Jul. 30, 2008 and assigned Serial No. 10-2008-0074522, the disclosure of which is incorporated herein by reference.

BACKGROUND OF THE INVENTION

1. Field of the Invention

The present invention relates generally to a Printed Circuit Board (PCB), and more particularly, to a PCB with a double structure provided by printing conductive ink/paste on a substrate and through electroless plating or electrolytic plating of a high-melting point metal thereon, and a method for manufacturing the same.

2. Description of the Related Art

Technology has recently been introduced that replaces copper cladding, which is a material used for a circuit pattern, with conductive ink/paste in an attempt to manufacture low-priced PCBs. The conductive ink is made by commonly dispersing metal particles having a diameter of several to several tens of nanometers in a solvent. When the conductive ink is printed on a substrate and heat is applied thereto at a specific temperature, organic additives such as dispersing agents are volatilized and gaps between the metal particles are contracted and sintered, forming conductors which are electromechanically connected to each other. The conductive paste is made by commonly dispersing metal particles having a diameter of several hundreds to several thousands of nanometers in an adhesive resin. When the conductive paste is printed on the substrate and heat is applied thereto at a specific temperature, the resin is cured and electromechanical contacts between the metal particles are fixed, forming conductors, which are connected to each other. A PCB with a circuit pattern made of conductive ink/paste is illustrated in FIG. 1. A circuit is formed by printing conductive ink/paste 2 on a polyimide substrate 1 in a predetermined pattern, and sintering the conductive ink or curing the conductive paste, by applying heat thereto in a specific condition.

However, while parts are adhered to the circuit pattern using solder, the circuit pattern may be melted down together with the solder due to a low melting point of the conductive ink/paste. Conventionally, a method of adhering parts to the circuit pattern using conductive adhesive was used to address this problem. In FIG. 1, part 4 is adhered to a circuit pattern 2 by applying a conductive adhesive 3 onto the circuit pattern 2 formed of the conductive ink/paste in a dispensing manner (not shown), and then curing the conductive adhesive 3 through the application of heat or ultraviolet rays. However, the dispensing process for conductive adhesive results in a significantly lower productivity than a Surface Mount Device (SMD) process achieved using solder. Further, the storage property of a material for the conductive adhesive is poor, and the material for the conductive adhesive is remarkably higher than the solder in price.

For the general PCB with a circuit pattern made of copper cladding, a double structure is well known that prevents the circuit pattern from being melted down together with the solder by plating a high-melting point metal on the circuit pattern to adhere parts onto the circuit pattern.

SUMMARY OF THE INVENTION

The present invention has been made to address at least the above problems and/or disadvantages and to provide at least the advantages described below. Accordingly, an aspect of the present invention provides a Printed Circuit Board (PCB) made by adhering parts onto a circuit pattern, formed by printing conductive ink/paste on a substrate, using solder, and a method for manufacturing the same.

Another aspect of the present invention provides a PCB made by reducing electric resistance of a circuit with a circuit pattern formed by printing conductive ink/paste on a substrate, thereby improving electric performance of the product, and a method for manufacturing the same.

A further aspect of the present invention provides a method for improving coherence between a substrate and a circuit pattern formed by printing conductive ink/paste on the substrate.

According to one aspect of the present invention, a PCB is provided. The PCB includes a circuit pattern formed by printing at least one of conductive ink and conductive paste on a substrate, and performing at least one of sintering a layer of the conductive ink and curing a layer of the conductive paste, by applying heat. The PCB also includes a primary plating layer formed through electroless plating or electrolytic plating of a high-melting point metal on the circuit pattern. The PCB further includes a secondary plating layer formed through electroless plating or electrolytic plating of a precious metal on the primary plating layer to improve wetting with solder.

According to another aspect of the present invention, a method for manufacturing a PCB is provided. At least one of conductive ink and conductive paste is printed on a substrate in a predetermined pattern. A circuit pattern is formed by performing at least one of sintering a layer of the conductive ink and curing a layer of the conductive paste, by applying heat. A primary plating layer is formed through electroless plating or electrolytic plating of a high-melting point metal on the circuit pattern. A secondary plating layer is formed through electroless plating or electrolytic plating of a precious metal on the primary plating layer to improve wetting with solder. Solder is applied onto the secondary plating layer by screen printing, mounting at least one part thereon, and melting the solder at a high temperature, ranging between 150° C. and 300° C., to adhere the parts onto the primary plating layer.

BRIEF DESCRIPTION OF THE DRAWINGS

The above and other aspects, features and advantages of the present invention will be more apparent from the following description when taken in conjunction with the accompanying drawings, in which.

DETAILED DESCRIPTION OF PREFERRED EMBODIMENTS

Figure 1:
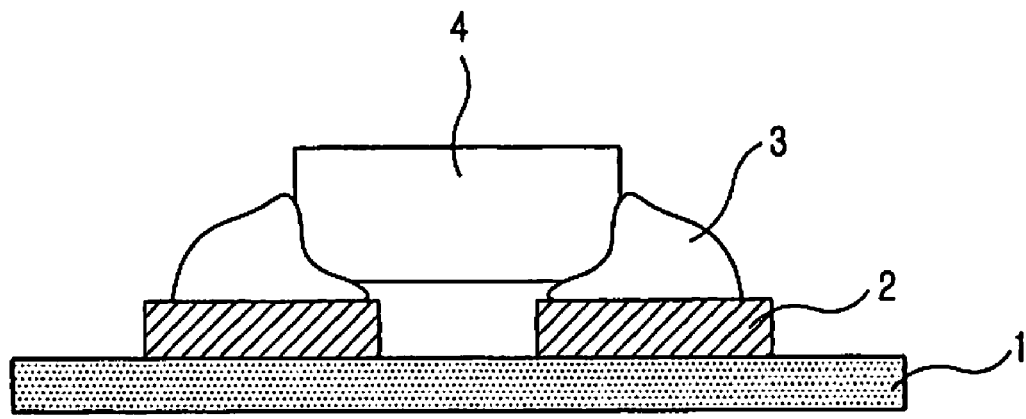
FIG. 1 is a diagram illustrating a cross-section of a conventional PCB with conductive ink/paste printed thereon.

Preferred embodiments of the present invention are described in detail with reference to the accompanying drawings. Throughout the drawings, the same or similar components may be designated by the same or similar reference numerals although they are illustrated in different drawings. Detailed descriptions of constructions or processes known in the art may be omitted to avoid obscuring the subject matter of the present invention.

The terms and words used in the following description and claims are not limited to their dictionary meanings, but, are merely used by the inventor to enable a clear and consistent understanding of the invention. Accordingly, it should be apparent to those skilled in the art that the following description of embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 2:
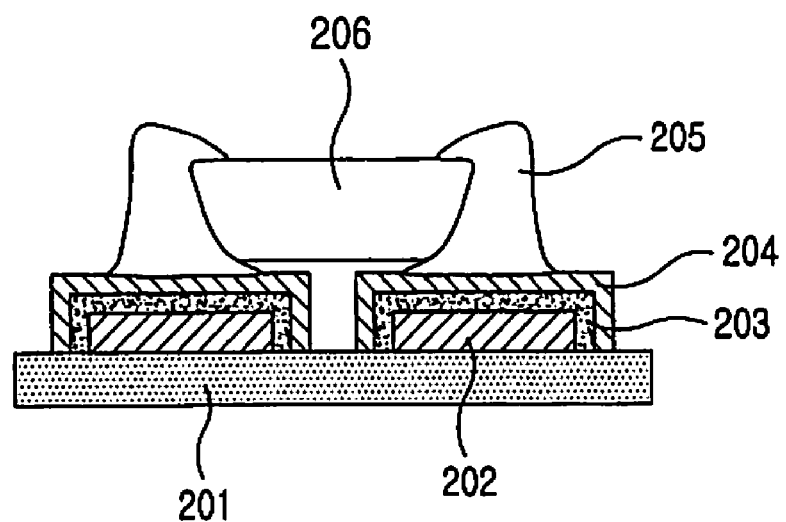
FIG. 2 is a diagram illustrating a cross-section of a PCB with conductive ink/paste printed thereon, having plating layers, according to an embodiment of the present invention.

As illustrated in FIG. 2, in a PCB with plating layers, a circuit pattern 202 is formed by printing conductive ink/paste on a substrate 201, and sintering the conductive ink or curing the conductive paste, by applying heat thereto.

The PCB has a primary plating layer 203 and a secondary plating layer 204. The primary plating layer 203 is formed through electroless plating or electrolytic plating of a high-melting point metal on the circuit pattern 202. The secondary plating layer 204 is formed on the primary plating layer 203 through electroless plating or electrolytic plating, so as to increase wetting of solder 205.

The primary plating layer 203 is made of at least one of nickel (Ni), a nickel-phosphorus (Ni—P) alloy, a nickel-tin (Ni—Sn) alloy, copper (Cu), a nickel-copper (Ni—Cu) alloy, etc. Herein, the primary plating layer 203 may include all metals having a high melting point.

The secondary plating layer 204 is made of gold (Au). However, the secondary plating layer is optional, when the primary plating layer is a nickel-tin alloy. Herein, the secondary plating layer 204 may include all metals that can increase wetting of the solder 205 at the surface of the primary plating layer 203.

The solder 205 is formed so as to adhere a part 206 onto the primary plating layer 203 by applying solder cream, through screen printing or the like, mounting a part thereon, melting the solder at a high temperature ranging between 150° C. and 300° C., and then solidifying it by cooling.

As illustrated in FIG. 2, the circuit pattern 202 is formed by printing conductive ink/paste on the substrate 201, made of polyimde or the like, in a predetermined pattern, and sintering the conductive ink or curing the conductive paste, by applying heat thereto in a specific condition.

The conductive ink is a solution provided by commonly dispersing metal particles having a diameter of several to several tens of nanometers in a solvent. Organic additives, including hydroxyl carbonate, are commonly dissolved in the solution in order to provide a dynamic printing characteristic of ink, i.e. thixotropy related to spoiling and transferring, and to adjust uniform dispersion of the metal particles. Silver (Ag) and copper (Cu), both having low melting points and high conductivity, are commonly selected for the metal particles. When the conductive ink is printed on the substrate and heat is applied thereto at a specific temperature, solvents and organic additives are first volatilized and dried. If heat is applied continuously, gaps between the metal particles are contracted and sintered, forming conductors between the metal particles, which are electromechanically connected to each other. However, if the solvents and organic additives are not fully removed in the drying process, the remaining solvents and organic additives may hinder gaps between the metal particles from being contracted and sintered.

In addition, when the solvent-removed metal particles are left in the air for a long time, oxidized layers may also hinder the gaps between the metal particles from being shrunk and sintered. Therefore, it is preferable that the drying and sintering processes for the conductive ink be carried out in succession. More preferably, heat can be applied at an atmosphere of inert gases, or that of a vacuum, to prevent oxidation on the surfaces of the metal particles in the drying and sintering processes. Also, it is preferable that the drying process is carried out at a low temperature for a long time and the sintering process lasts for a short time at a high temperature. More specifically, it is preferable that the drying process is conducted at a temperature ranging between 100° C. and 130° C. for a time ranging between 10 and 30 minutes. Also, it is preferable that the sintering process is performed at a temperature ranging between 130° C. and 260° C. for a time ranging between 5 and 20 minutes. A boundary temperature between the drying process and the sintering process can be preferably adjusted in proportion to a pyrolysis temperature of the organic additives. Further, it is most preferable that a density of oxygen is managed below 1000 ppm by maintaining an inert atmosphere of $N_2$, He and Ar gases, or a vacuum atmosphere, in the drying and sintering processes.

In the drying and sintering processes for the conductive ink, if the sintering of the metal particles is carried out insufficiently, electric resistance of the circuit pattern may increase. In addition, during a plating process following the sintering process, a plating solution may infiltrate into gaps between the metal particles and rust the metal particles and the substrate, causing a reduction in coherence of the substrate with the circuit pattern. In order to solve this problem, it is very important to secure a circuit pattern with a fine microstructure by minimizing the gaps between the metal particles.

Figure 3:
FIG. 3 is a microstructure image, observed by a Scanning Electron Microscope (SEM), of a circuit pattern formed according to an embodiment of the present invention.

In a first embodiment shown in Table 1 below, a circuit pattern was formed by printing conductive ink, provided by dispersing metal powders having an average diameter of 30 nm, on a polyimide substrate, performing a drying process at a temperature of 150° C. for 10 minutes while maintaining an $N_2$ atmosphere, and performing a sintering process at a temperature of 150° C. for 10 minutes while maintaining an $N_2$ atmosphere. FIG. 3 is a microstructure image, observed by a Scanning Electron Microscope (SEM), of the circuit pattern formed in the first embodiment. The SEM image of FIG. 3 has a non-fine microstructure as the gaps between the metal particles are not fully removed. In Table 1, the circuit pattern in the first embodiment has specific electric resistance of $1.5 \times 10^{-5}$ $\Omega cm^{-1}$. Further, after copper with a thickness of 15 μm was electrolytic-plated on the circuit pattern, coherence with the substrate, measured by 180° peel test, was 250 gf/cm.

Figure 4:
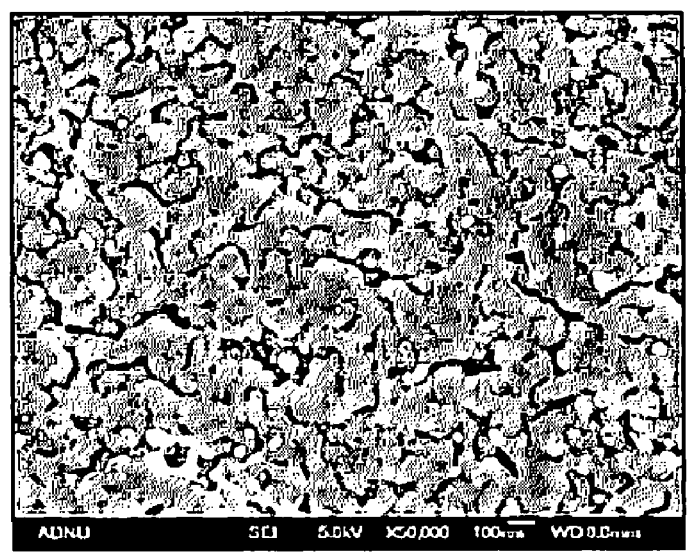
FIG. 4 is a microstructure image, observed by an SEM, of a circuit pattern formed according to another embodiment of the present invention.

In a second embodiment shown in Table 1, a circuit pattern was formed by printing conductive ink, provided by dispersing metal powders having an average diameter of 30 nm, on a polyimide substrate, performing a drying process at a temperature of 120° C. for 20 minutes while maintaining an $N_2$ atmosphere, and performing a sintering process at a temperature of 200° C. for 10 minutes while maintaining an $N_2$ atmosphere. FIG. 4 is a microstructure image, observed by an SEM, of the circuit pattern formed in the second embodiment. It is to be noted that the SEM image of FIG. 4 has a fine microstructure as the gaps between the metal particles are fully removed. In Table 1, the circuit pattern in the second embodiment has specific electric resistance of $4.0 \times 10^{-6}$ $\Omega cm^{-1}$. Further, after copper with a thickness of 15 μm was electrolytic-plated on the circuit pattern, coherence with the substrate, measured by 180° peel test, was 550 gf/cm. Therefore, when the fine microstructure, as described above, is formed by applying specific temperature, time and atmosphere in the drying and sintering processes for the circuit pattern formed of the conductive ink, the infiltration of the plating solution and the corrosion of the circuit pattern are suppressed during the plating process, making it possible to improve coherence of the substrate.

TABLE 1

|  | Embodiment 1 | Embodiment 2 |
| --- | --- | --- |
| Drying temperature (° C.) | 150 | 120 |
| Drying time (minutes) | 10 | 20 |
| Sintering temperature (° C.) | 150 | 200 |
| Sintering time (minutes) | 10 | 10 |
| Specific resistance ($\times 10^{-6}\,\Omega\mathrm{cm}^{-1}$) | 15.0 | 4.0 |
| Peel Strength (gf/cm) | 250 | 550 |

The conductive paste is a viscous solution provided by commonly dispersing metal particles having a diameter of several hundreds to several thousands of nanometers in an adhesive resin. Silver (Ag) and copper (Cu), both having low melting points and high conductivity, are commonly selected for the metal particles. When the conductive paste is printed on the substrate and heat is applied thereto at a specific temperature, the resin is cured and contacts between the metal particles are fixed, forming conductors, which are connected to each other. However, with respect to a volume of the viscous solution, when a ratio of the metal particles is below 70%, electric resistance is high due to insufficient contacts between the metal particles, and when a ratio of the resin is below 10%, coherence of the substrate with the circuit pattern is low because of insufficient adhesion of the substrate with the metal particles. Therefore, it is most preferable that a ratio of the metal particles ranges between 70% and 90% and a ratio of the resin ranges between 30% and 10%.

In a third embodiment shown in Table 2 below, a circuit pattern formed by printing conductive paste has specific electric resistance of $7.0\times10^{-5}\,\Omega\mathrm{cm}^{-1}$, when a ratio of the metal particles having an average diameter of 1500 nm is 70% and a ratio of the resin is 30% with regard to a volume of the viscous solution. In addition, after copper with a thickness of 15 μm was electrolytic-plated on the circuit pattern, coherence with the substrate, measured by 180° peel test, was 800 gf/cm. In a fourth embodiment shown in Table 2, a circuit pattern formed by printing conductive paste has specific electric resistance of $3.5\times10^{-5}\,\Omega\mathrm{cm}^{-1}$, when a ratio of the metal particles having an average diameter of 1500 nm is 80% and a ratio of the resin is 20% with regard to a volume of the viscous solution. Further, after copper with a thickness of 15 μm was electrolytic-plated on the circuit pattern, coherence with the substrate, measured by 180° peel test, was 800 gf/cm. In a fifth embodiment shown in Table 2, a circuit pattern formed by printing conductive paste has specific electric resistance of $3.0\times10^{-5}\,\Omega\mathrm{cm}^{-1}$, when a ratio of the metal particles having an average diameter of 1500 nm is 90% and a ratio of the resin is 10% with regard to a volume of the viscous solution. Further, after copper with a thickness of 15 μm was electrolytic-plated on the circuit pattern, coherence with the substrate, measured by 180° peel test, was 400 gf/cm. Therefore, it is possible to reduce electric resistance of the circuit and improve coherence of the substrate with the circuit pattern by adjusting a ratio of the metal particles and a ratio of the resin in a specific condition during manufacturing of the conductive paste.

TABLE 2

|  | Embodiment 3 | Embodiment 4 | Embodiment 5 |
| --- | --- | --- | --- |
| Ratio of metal particles (%) | 70 | 80 | 90 |
| Ratio of resin (%) | 30 | 20 | 10 |
| Specific resistance ($\times 10^{-5}\,\Omega\mathrm{cm}^{-1}$) | 7.0 | 3.5 | 3.0 |
| Peel Strength (gf/cm) | 800 | 800 | 400 |

While the invention has been shown and described with reference to a certain preferred embodiments thereof, it will be understood by those skilled in the art that various changes in form and details may be made therein without departing from the spirit and scope of the invention as defined by the appended claims and their equivalents.

What is claimed is:

1. A printed circuit board comprising:
    a circuit pattern formed by printing at least one of conductive ink and conductive paste on a substrate, and performing at least one of sintering a layer of the conductive ink and curing a layer of the conductive paste, by applying heat;
    a primary plating layer formed through electroless plating or electrolytic plating of a high-melting point metal on the circuit pattern; and
    a secondary plating layer formed through electroless plating or electrolytic plating of a precious metal on the primary plating layer to improve wetting with solder.

2. The printed circuit board of claim 1, wherein the primary plating layer comprises a combination of at least one of nickel (Ni), a nickel-phosphorus (Ni—P) alloy, a nickel-tin (Ni—Sn) alloy, copper (Cu), and a nickel-copper (Ni—Cu) alloy.

3. The printed circuit board of claim 1, wherein the secondary plating layer comprises gold (Au).

4. The printed circuit board of claim 1, wherein the solder is applied onto the secondary plating layer in the form of solder cream, and the solder is melted at a high temperature ranging between 150° C. and 300° C. to adhere at least one part onto the primary plating layer.

5. The printed circuit board of claim 1, wherein the substrate comprises a combination of at least one of polyimide, FR4 (Flame Retardant Type 4),and heat-resistant epoxy.

6. The printed circuit board of claim 1, wherein the secondary plating layer is optional, when the primary plating layer comprises a nickel-tin (Ni—Sn) alloy.

7. The printed circuit board of claim 1, wherein, when the circuit pattern is formed by printing the conductive paste, a volume ratio of metal particles ranges between 70% and 90%, and a volume ratio of resin ranges between 30% and 10%.

8. The printed circuit board of claim 1, wherein performing a sintering of the layer of the conductive ink comprises:
    performing a drying process at a temperature ranging between 100° C. and 130° C. for a time ranging between 10 and 30 minutes; and
    performing a sintering process at a temperature ranging between 130° C. and 260° C. for a time ranging between 5 and 20 minutes.

9. The printed circuit board of claim 1, wherein performing sintering of the layer of the conductive ink comprises:
    managing a density of oxygen below 1000 ppm by maintaining an inert atmosphere of $N_2$, He and Ar gases or by maintaining a vacuum atmosphere.

* * * * *